United States Patent
Yang et al.

(10) Patent No.: US 9,910,537 B2
(45) Date of Patent: Mar. 6, 2018

(54) IN-CELL TOUCH SCREEN PANEL, DRIVING METHOD THEREOF, AND DISPLAY DEVICE

(71) Applicants: Boe Technology Group Co., Ltd., Beijing (CN); Beijing Boe Optoelectronics Technology Co., Ltd., Beijing (CN)

(72) Inventors: Shengji Yang, Beijing (CN); Xue Dong, Beijing (CN); Haisheng Wang, Beijing (CN); Xiaochuan Chen, Beijing (CN); Yingming Liu, Beijing (CN); Weijie Zhao, Beijing (CN); Hongjuan Liu, Beijing (CN); Wei Li, Beijing (CN); Chunlei Wang, Beijing (CN); Xiaobo Xie, Beijing (CN); Rui Xu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/105,543

(22) PCT Filed: Sep. 29, 2015

(86) PCT No.: PCT/CN2015/091061
§ 371 (c)(1),
(2) Date: Jun. 16, 2016

(87) PCT Pub. No.: WO2016/206224
PCT Pub. Date: Dec. 29, 2016

(65) Prior Publication Data
US 2017/0205932 A1    Jul. 20, 2017

(30) Foreign Application Priority Data

Jun. 23, 2015  (CN) .......................... 2015 1 0350224

(51) Int. Cl.
*G06F 3/045*  (2006.01)
*G06F 3/041*  (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ...... G06F 3/0412; G06F 3/0416; G06F 3/044; G09G 2300/0426; G09G 2310/0251;
(Continued)

(56) References Cited

U.S. PATENT DOCUMENTS

2011/0109568 A1* 5/2011 Wu .................. G06F 3/0412
                                                          345/173
2015/0022484 A1  1/2015 Chiu et al.
(Continued)

FOREIGN PATENT DOCUMENTS

CN  103984442 A  8/2014
CN  104035640 A  9/2014
(Continued)

OTHER PUBLICATIONS

International Search Report and Written Opinion of the ISA in PCT/CN2015/091061 with English translation. 15 pages.
(Continued)

*Primary Examiner* — Insa Sadio
(74) *Attorney, Agent, or Firm* — Womble Bond Dickinson (US) LLP

(57) ABSTRACT

The present disclosure discloses an in-cell touch screen panel, a driving method thereof and a display device. A plurality of sub-pixels are grouped into sub-pixel groups, each of which includes at least two sub-pixels. Cathode layers of different sub-pixel groups are independent of one
(Continued)

another. The cathode layers are reused as self-capacitance electrodes. A driving chip determines a touch position by detecting a change in capacitance of the cathode layers, thereby achieving touch control functionality. The driving chip outputs, in a fourth phase, signals to the cathode layers and to the signal terminals of each sub-pixel circuit, each of the signals is a superposition of the signal output in a third phase with a touch scanning signal such that each sub-pixel circuit operates in the fourth phase in the same state as in the third phase.

19 Claims, 11 Drawing Sheets

(51) Int. Cl.
G06F 3/044 (2006.01)
H01L 27/32 (2006.01)
(52) U.S. Cl.
CPC ........ *H01L 27/323* (2013.01); *H01L 27/3246* (2013.01); *H01L 27/3276* (2013.01)

(58) Field of Classification Search
CPC ......... G09G 2320/0646; G09G 3/3258; G09G 3/3291; H01L 27/323; H01L 27/3255
See application file for complete search history.

(56) References Cited

U.S. PATENT DOCUMENTS

| 2016/0203761 A1 | 7/2016 | Zhang |
| 2016/0274715 A1 | 9/2016 | Wang et al. |

FOREIGN PATENT DOCUMENTS

| CN | 104076966 A | 10/2014 |
| CN | 104167177 A | 11/2014 |
| CN | 104299571 A | 1/2015 |
| CN | 104536632 A | 4/2015 |
| CN | 104898888 A | 9/2015 |
| KR | 1020150037303 A1 | 4/2015 |

OTHER PUBLICATIONS

Office Action in Chinese Application No. 201510350224.X dated Jun. 12, 2017, with English translation.

* cited by examiner

IN-CELL TOUCH SCREEN PANEL, DRIVING METHOD THEREOF, AND DISPLAY DEVICE

CROSS-REFERENCE TO THE RELATED APPLICATIONS

The present application is the U.S. national phase entry of PCT/CN2015/091061, with an international filing date of Sep. 29, 2015, which claims the benefit of Chinese Patent Application No. 201510350224.X, filed on Jun. 23, 2015, the entire disclosures of which are incorporated herein by reference.

TECHNICAL FIELD

The present disclosure relates to the field of touch display technologies, and particularly to an in-cell touch screen panel, a driving method thereof, and a display device.

BACKGROUND

With swift development of the display technologies, touch screen panels have been applied extensively in daily life. At present, touch screen panels may be classified in terms of their structures into add-on touch screen panels, on-cell touch screen panels and in-cell touch screen panels. For the add-on touch screen panel, a touch panel and a display panel are produced separately, and then fitted together to form a display screen which has a touch function. The add-on touch screen panel has drawbacks such as high manufacturing cost, low light transmissivity, and a large thickness. With touch electrodes of a touch panel being embedded in a display panel, the in-cell touch screen panel appeals to panel manufactures since it may have a thinner thickness as a whole, and a substantially reduced manufacturing cost.

Currently, in-cell touch screen panels are mainly used in liquid crystal displays. As is well known, the organic light-emitting diode (OLED) display is among intensively investigated fields of state-of-the-art flat panel displays. As compared with the liquid crystal display, the OLED display has advantages such as low energy consumption, low product cost, self-light emission, a wide view angle, and quick responsiveness. Presently, the OLED displays have begun to replace conventional LCD displays in applications such as mobile phones, PDAs and digital cameras. Hence, it is a technical problem that needs an urgent solution for a person having ordinary skill in the art to provide an organic electroluminescent display panel-based in-cell touch screen panel.

SUMMARY

In view of the above, embodiments of the present disclosure provide an in-cell touch screen panel, a driving method thereof, and a display device, which are used to implement an organic electroluminescent display panel-based in-cell touch screen panel.

According to a first aspect of the present disclosure, an in-cell touch screen panel is provided which comprises: an array substrate; a plurality of sub-pixels located on the array substrate, each of the plurality of sub-pixels comprising an organic light-emitting device and a sub-pixel circuit electrically connected with the organic light-emitting device, the organic light-emitting device comprising an anode layer, a light-emitting layer and a cathode layer that are located on the array substrate in turn; and a driving chip. The plurality of sub-pixels are grouped into sub-pixel groups each comprising at least two sub-pixels. The cathode layers of different sub-pixel groups are independent of one another. The driving chip outputs signals to signal terminals of each sub-pixel circuit and to the cathode layer of each sub-pixel group. Each of the signals output in a touch scanning phase is a superposition of the signal output in a preceding phase with a touch scanning signal, such that each sub-pixel circuit operates in the touch scanning phase in the same state as in the preceding phase.

In some embodiments, the sub-pixel circuit comprises a data write module, a reset module, a light-emitting control module, a driving control module, a compensating module, a data signal terminal, a write control signal terminal, a reset signal terminal, a reset control signal terminal, a light-emitting control signal terminal, and a reference signal terminal. An input terminal of the data write module is connected with the data signal terminal, a control terminal thereof is connected with the write control signal terminal, and an output terminal thereof is connected with an input terminal of the driving control module. An input terminal of the reset module is connected with the reset signal terminal, a control terminal thereof is connected with the reset control signal terminal, and an output terminal thereof is connected with a control terminal of the driving control module. A first input terminal of the compensating module is connected with the reference signal terminal, a second input terminal thereof is connected with an output terminal of the driving control module, a control terminal thereof is connected with the write control signal terminal, and an output terminal thereof is connected with the control terminal of the driving control module. A first input terminal of the light-emitting control module is connected with the reference signal terminal, a second input terminal thereof is connected with the output terminal of the driving control module, a control terminal thereof is connected with the light-emitting control signal terminal, a first output terminal thereof is connected with the input terminal of the driving control module, and a second output terminal thereof is connected with the anode layer of a corresponding organic light-emitting device. The cathode layer of each of the sub-pixel groups is connected with the driving chip via a respective wire.

In some embodiments, the data write module is configured to, when the signal of the write control signal terminal is a write control signal, provide the signal of the data signal terminal to the input terminal of the driving control module. The compensating module is configured to, when the signal of the write control signal terminal is a write control signal, begin to charge to make a voltage difference between the input terminal and control terminal of the driving control module a threshold voltage of the driving control module. The reset module is configured to, when the signal of the reset control signal terminal is a reset control signal, provide a signal of the reset signal terminal to the control terminal of the driving control module. The light-emitting control module is configured to, when the signal of the light-emitting control signal terminal is a light-emitting control signal, control, together with the compensating module, the driving control module to drive the organic light-emitting device to emit light.

In some embodiments, the driving chip is configured during a frame period to: output, in a first phase, a reset control signal to the reset control signal terminal and a reset signal to the reset signal terminal; output, in a second phase, a write control signal to the write control signal terminal and a data signal to the data signal terminal; output, in a third phase, a light-emitting control signal to the light-emitting control signal terminal; and output, in a fourth phase that is the touch scanning phase, to the signal terminals of the sub-pixel circuit and to the cathode layer of each sub-pixel group a superposition of respective signals output to the signal terminals and the cathode layer in the third phase with a same touch scanning signal, and determine a touch position by detecting a change in capacitance of the cathode layer via the respective wire. The driving chip outputs, from the first phase to the third phase, a first reference signal to the reference signal terminal, and a second reference signal to the cathode layer of the organic light-emitting device of the sub-pixel via the respective wire.

In some embodiments, the data write module comprises a first switch transistor, a gate thereof being the control terminal of the data write module, a source thereof being the input terminal of the data write module, and a drain thereof being the output terminal of the data write module.

In some embodiments, the reset module comprises a second switch transistor, a gate thereof being the control terminal of the reset module, a source thereof being the input terminal of the reset module, and a drain thereof being the output terminal of the reset module.

In some embodiments, the compensating module comprises a third switch transistor and a capacitor. A gate of the third switch transistor is the control terminal of the compensating module, a source thereof is the second input terminal of the compensating module, and a drain thereof is the output terminal of the compensating module that is connected with a terminal of the capacitor. The other terminal of the capacitor is the first input terminal of the compensating module.

In some embodiments, the driving control module comprises a drive transistor, a gate thereof being the control terminal of the driving control module, a source thereof being the input terminal of the driving control module, and a drain thereof being the output terminal of the driving control module.

In some embodiments, the light-emitting control module comprises a fourth switch transistor and a fifth switch transistor. A gate of the fourth switch transistor is connected with a gate of the fifth switch transistor and is the control terminal of the light-emitting control module, a source of the fourth switch transistor is the first input terminal of the light-emitting control module, and a drain of the fourth switch transistor is the first output terminal of the light-emitting control module. A source of the fifth switch transistor is the second input terminal of the light-emitting control module, and a drain thereof is the second output terminal of the light-emitting control module.

In some embodiments, the drive transistor is a P-type transistor.

In some embodiments, the switch transistors each are a P-type transistor or an N-type transistor.

In some embodiments, the sub-pixel circuit is located between the anode layer and the array substrate. The array substrate further comprises data lines for connecting the data signal terminals of the sub-pixel circuits to the driving chip, the data lines being disposed in the same layer as and insulated from the wires.

In some embodiments, the transistors in the sub-pixel circuit each comprise an active layer, a gate insulating layer, a gate electrode, an insulating layer, a source electrode and a drain electrode that are located on the array substrate in turn. The source electrode and the drain electrode are disposed on the same layer as the data lines. The wires are connected with respective cathode layers through respective vias.

In some embodiments, the in-cell touch screen panel further comprises: a planarized layer located between the layer where the source electrodes and the drain electrodes are disposed and the anode layers; a sub-pixel defining layer located between the cathode layers and the planarized layer and surrounding the light-emitting layers; and cathode connecting portions disposed on the same layer as the anode layers. The cathode connecting portions are connected with respective wires through respective vias running through the planarized layer. The cathode layers are connected with respective cathode connecting portions through respective vias running through the sub-pixel defining layer.

In some embodiments, each of the plurality of sub-pixels has a hexagonal shape and the sub-pixels are arranged regularly on the array substrate. The sub-pixels are arranged side by side in a row direction, the sub-pixels at corresponding positions in every two adjacent rows are arranged staggered in a column direction, the vias for connecting the cathode layers with the wires are arranged between every two adjacent sub-pixels in each row of sub-pixels, and vias for connecting the anode layers with the drain electrodes are arranged in a gap between two adjacent rows. Alternatively, the sub-pixels are arranged side by side in a column direction, the sub-pixels at corresponding positions in every two adjacent columns are arranged staggered in a row direction, the vias for connecting the cathode layers with the wires are arranged between every two adjacent sub-pixels in each column, and vias for connecting the anode layers with the drain electrodes are arranged in a gap between two adjacent columns.

According to a second aspect of the present disclosure, a display device is further provided which comprises any one of in-cell touch screen panels as described in the first aspect of the present disclosure.

According to a third aspect of the present disclosure, a method of driving any one of in-cell touch screen panel as described in the first aspect of the present disclosure is provided which comprises: outputting, by the driving chip during a frame period, signals to signal terminals of each sub-pixel circuit and to the cathode layer of each sub-pixel group. Each of the signals output in a touch scanning phase is a superposition of the signal output in a preceding phase with a touch scanning signal such that each sub-pixel circuit operates in the touch scanning phase in the same state as in the preceding phase.

In some embodiments, the driving method comprises: outputting, by the driving chip in a first phase of the frame period, a reset control signal to the reset control signal terminal, a reset signal to the reset signal terminal, a first reference signal to the first reference signal terminal, and a second reference signal to the cathode layer of the organic light-emitting device of the sub-pixel through the respective wire, such that the reset module supplies the signal of the reset signal terminal to the control terminal of the driving control module; outputting, by the driving chip in a second phase of the frame period, a write control signal to the write control signal terminal, a data signal to the data signal terminal, the first reference signal to the first reference signal terminal, and the second reference signal to the cathode layer of the organic light-emitting device of the sub-pixel through the respective wire, such that the data write module supplies the signal of the data signal terminal to the input terminal of the driving control module, and the compensating module begins to charge to make a voltage difference between the input terminal and the control terminal of the driving control module a threshold voltage of the driving control module; outputting, by the driving chip in a third phase of the frame period, a light-emitting control signal to the light-emitting control signal terminal of the sub-pixel circuit of the sub-pixel, the first reference signal to the first reference signal terminal, and the second reference signal to the cathode layer of the organic light-emitting device of the sub-pixel through the respective wire, such that the light-emitting control module and the compensating module jointly control the driving control module to drive the organic light-emitting device to emit light; and outputting, by the driving chip in a fourth phase of the frame period that is the touch scanning phase, to the signal terminals of the sub-pixel circuit and to the cathode layer of each sub-pixel group a superposition of respective signals output to the signal terminals and the cathode layer in the third phase with a same touch scanning signal, and determining a touch position by detecting a change in capacitance of the cathode layer via the respective wire.

In the in-cell touch screen panel, the driving method thereof and the display device according to embodiments of the present disclosure, one sub-pixel group is comprised of at least two sub-pixels, and cathode layers of different sub-pixel groups are independent of one another. This results from segmenting the cathode layer that is otherwise a whole surface in the prior art, and thus a sub-pixel group corresponds to a segment region in the segmented cathode layer. The cathode layer of each sub-pixel group is connected with the driving chip through a wire, which cathode layer is then reused as a self-capacitance touch electrode. The driving chip applies a touch scanning signal to the cathode layer via the wire, and determines a touch position by detecting a change in capacitance of the cathode layer via the wire, thereby achieving touch control functionality. Furthermore, in the in-cell touch screen panel, each of the signals output by the driving chip to the signal terminals of the sub-pixel circuit and to the cathode layer in the fourth phase is a superposition of the signal output in the third phase with a touch scanning signal. This allows the sub-pixel circuit to operate in the same state as in the third phase (i.e., the light-emitting display phase). As such, where the touch screen panel is not touched by a human body, the capacitance provided by respective self-capacitance electrodes remains unchanged before and after application of the touch scanning signal, thereby ensuring accuracy of the touch position determination.

DETAILED DESCRIPTION

The in-cell touch screen panel according to embodiments of the present disclosure, a driving method thereof and a display device are described below in detail with reference to the accompanying drawings. The thickness and shape of the layers shown in the figures are not drawn to scale and are only intended to illustrate the content of the disclosure.

Figure 1:
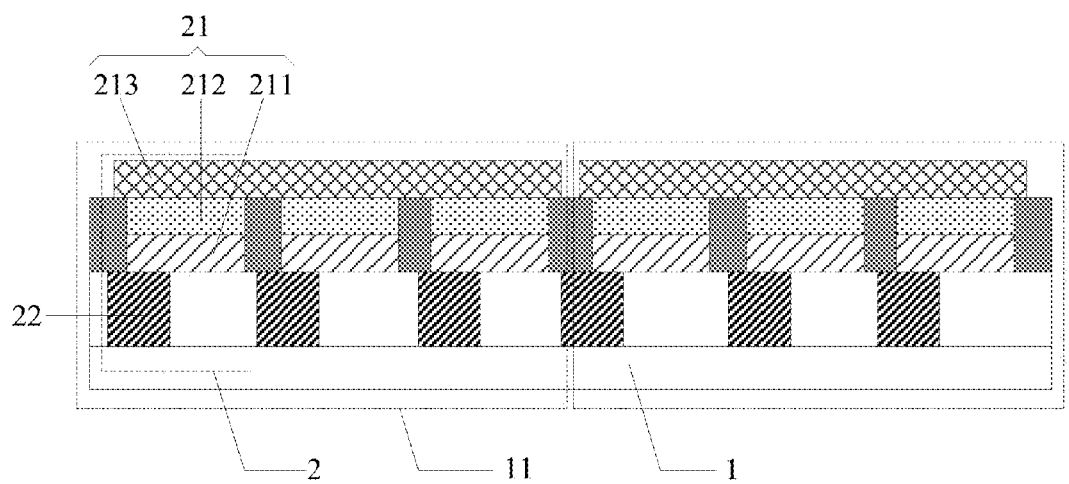
FIG. 1 is a structural schematic view of an in-cell touch screen panel according to an embodiment of the present disclosure.
Figure 3:
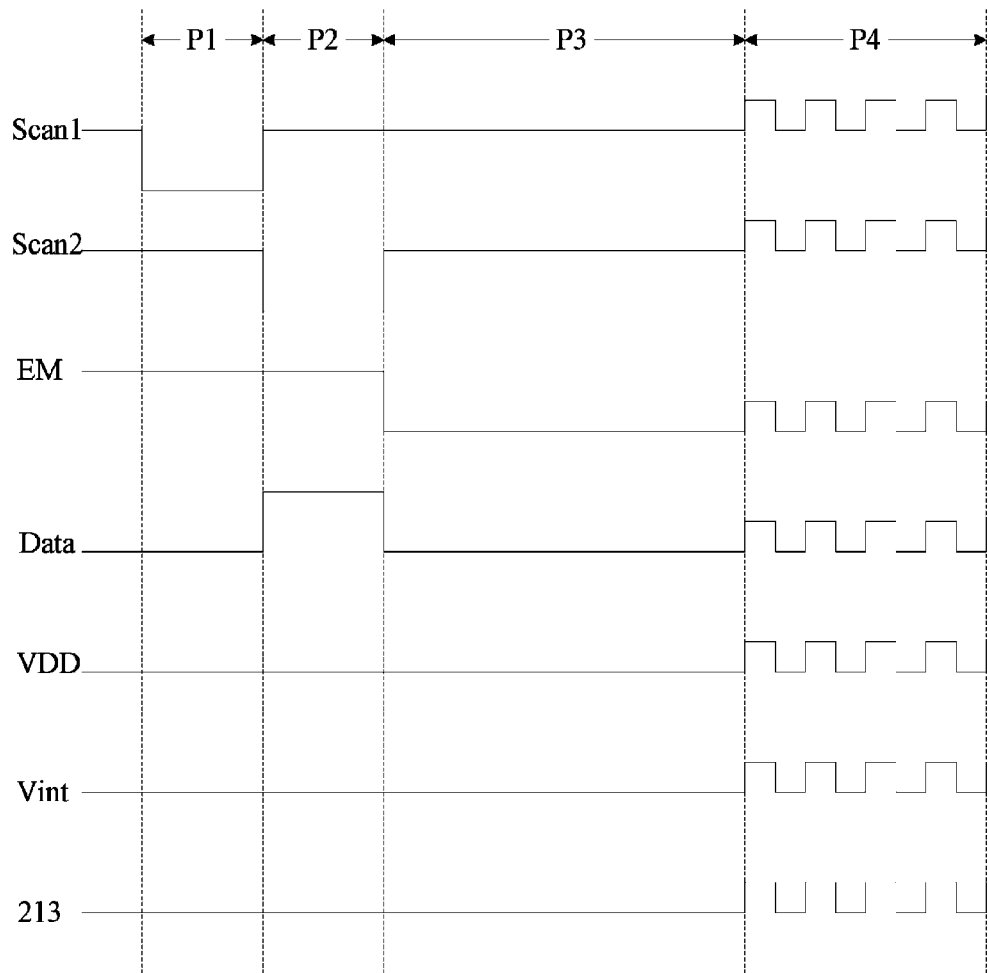
FIG. 3 is a schematic sequence diagram of signals output from a driving chip to signal terminals of a sub-pixel circuit and to a cathode layer in a frame period.

FIG. 1 is a structural schematic view of an in-cell touch screen panel according to an embodiment of the present disclosure. As shown in FIG. 1, the in-cell touch screen panel includes an array substrate 1 and a plurality of sub-pixels 2 located on the array substrate 1. The sub-pixels 2 each comprise an organic light-emitting device 21 and a sub-pixel circuit 22 electrically connected with the organic light-emitting device 21 (the specific structure of the sub-pixel circuit is not shown in FIG. 1). The organic light-emitting device 21 comprises an anode layer 211, a light-emitting layer 212 and a cathode layer 213 that are located on the array substrate in turn in a direction away from the array substrate 1. The sub-pixels 2 are grouped into sub-pixel groups each comprising at least two sub-pixels 2, and the cathode layers 213 belonging to different sub-pixel groups are independent of one another. The touch screen panel further comprises a driving chip (not shown in FIG. 1) for outputting signals to signal terminals of respective sub-pixel circuits 22 and the cathode layers 213 of the sub-pixel groups. In a frame period, the signals output from the driving chip to the signal terminals of respective sub-pixel circuits and to the cathode layers may have sequences as shown in FIG. 3, which will be discussed later.

Figure 2:
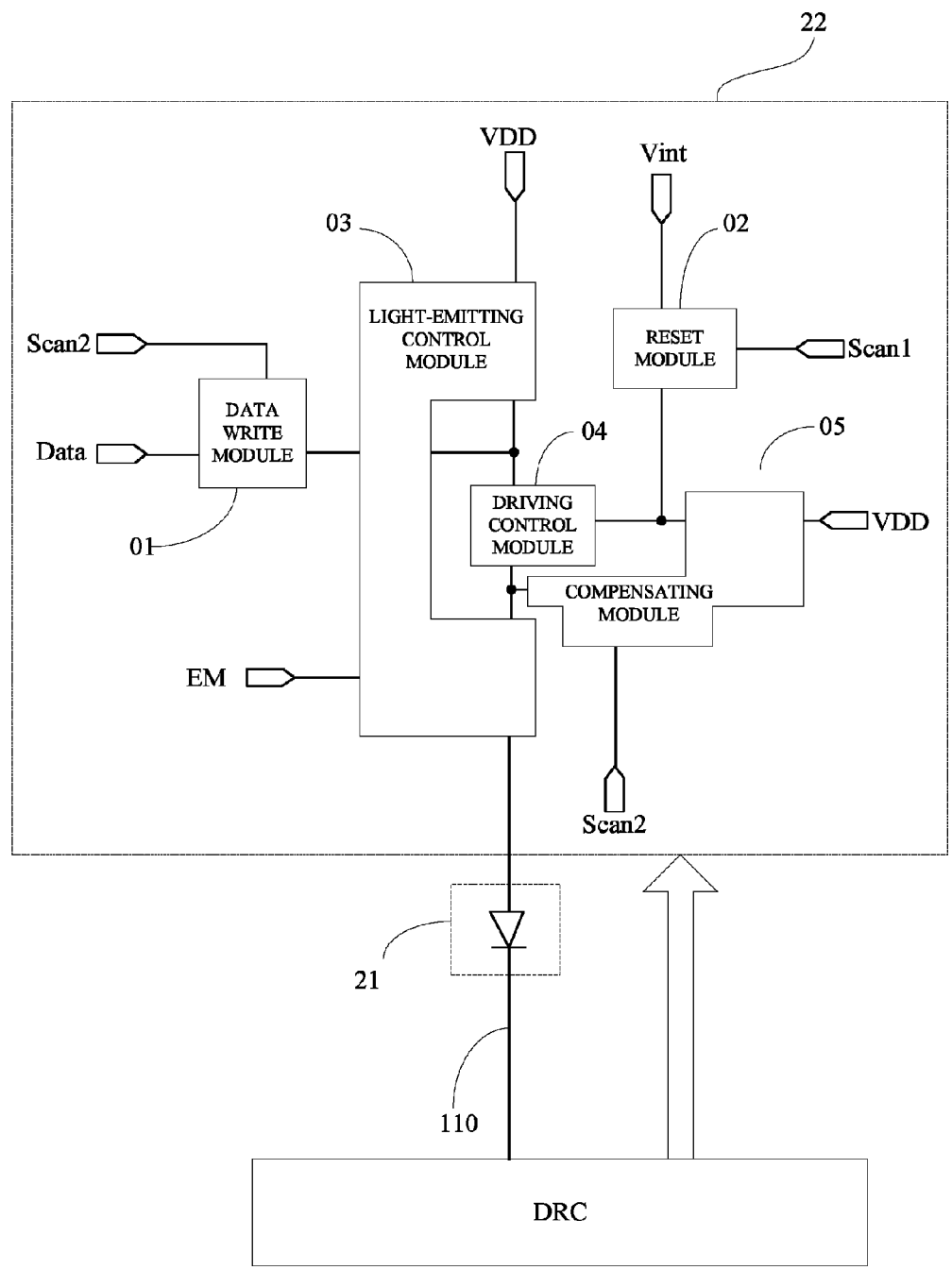
FIG. 2 is a structural schematic view of a sub-pixel circuit according to an embodiment of the present disclosure.

FIG. 2 is a structural schematic view of a sub-pixel circuit according to an embodiment of the present disclosure. As shown in FIG. 2, the sub-pixel circuits 22 each comprise a data write module 01, a reset module 02, a light-emitting control module 03, a driving control module 04, a compensating module 05, a data signal terminal (i.e., "Data"), a write control signal terminal Scan2, a reset signal terminal Vint, a reset control signal terminal Scan1, a light-emitting control signal terminal EM, and a reference signal terminal VDD.

An input terminal of the data write module 01 is connected with the data signal terminal "Data", a control terminal thereof is connected with the write control signal terminal Scan2, and an output terminal thereof is connected with an input terminal of the driving control module 04. An input terminal of the reset module 02 is connected with the reset signal terminal, a control terminal thereof is connected with the reset control signal terminal Scan1, and an output terminal thereof is connected with a control terminal of the driving control module 04. A first input terminal of the compensating module 05 is connected with the reference signal terminal VDD, a second input terminal thereof is connected with an output terminal of the driving control module 04, a control terminal thereof is connected with the write control signal terminal Scan2, and an output terminal thereof is connected with the control terminal of the driving control module 04. A first input terminal of the light-emitting control module 03 is connected with the reference signal terminal VDD, a second input terminal thereof is connected with the output terminal of the driving control module 04, a control terminal thereof is connected with the light-emitting control signal terminal EM, a first output terminal thereof is connected with the input terminal of the driving control module 04, and a second output terminal thereof is connected with the anode layer 211 of a corresponding organic light-emitting device 21. In addition, the cathode layers 213 of respective sub-pixel groups 11 are connected with the driving chip DRC via respective wires 110.

When the signal of the write control signal terminal Scan2 is a write control signal, the data write module 01 provides the signal of the data signal terminal "Data" to the input terminal of the driving control module 04. When the signal of the write control signal terminal Scan2 is a write control signal, the compensating module 05 begins to charge to make a voltage difference between the input terminal and control terminal of the driving control module 04 a threshold voltage of the driving control module 04. When the signal of the reset control signal terminal Scan1 is a reset control signal, the reset module 02 provides the signal of the reset signal terminal Vint to the control terminal of the driving control module 04. When the signal of the light-emitting control signal terminal EM is a light-emitting control signal, the light-emitting control module 03 and the compensating module 05 jointly control the driving control module 04 to drive the organic light-emitting device 21 to emit light.

FIG. 3 is a schematic sequence diagram of the signals output from the driving chip to signal terminals of a sub-pixel circuit and to a cathode layer in a frame period. As shown in FIG. 3, for each sub-pixel, the driving chip is configured to operate as follows during a frame period. In a first phase P1, the driving chip outputs the reset control signal to the reset control signal terminal Scan1 of the sub-pixel circuit 22 of the sub-pixel 2, and outputs the reset signal to the reset signal terminal Vint. In a second phase P2, the driving chip outputs the write control signal to the write control signal terminal Scan2 and outputs a data signal to the data signal terminal "Data". In a third phase P3, the driving chip outputs a light-emitting control signal to the light-emitting control signal terminal EM. From the first phase P1 to the third phase P3, the driving chip outputs a first reference signal to the reference signal terminal VDD, and outputs a second reference signal to the cathode layer 213 of the organic light-emitting device 21 of the sub-pixel 2 via the respective wire 110. In a fourth phase P4, the driving chip outputs respective signals to the signal terminals (Scan1, Scan2, Vint, Data, EM and VDD) of the sub-pixel circuit 2 and to the cathode layer 213, each of which signals is a superposition of the signal output in the third phase with a touch scanning signal such that respective modules of the sub-pixel circuit 22 have the same operating state as that in the third phase P3. Also, the driving chip detects a change in capacitance of the cathode layer 213 via the respective wire 110 to determine a touch position.

In the in-cell touch screen panel according to the embodiment of the present disclosure, the sub-pixels are grouped into sub-pixel groups each comprising at least two sub-pixels, and the cathode layers belonging to different sub-pixel groups are independent of one another. This results from segmenting the cathode layer that is otherwise a whole surface in the prior art, and thus a sub-pixel group corresponds to a segment region in the segmented cathode layer. The cathode layers of the sub-pixel groups are connected with the driving chip through respective wires, which cathode layers are then reused as self-capacitance touch electrodes. The driving chip applies touch scanning signals to the cathode layers via the wires, and determines a touch position by detecting a change in capacitance of the cathode layers via the wires, thereby achieving touch control functionality. Furthermore, in the in-cell touch screen panel, each of the signals output by the driving chip to the signal terminals of the sub-pixel circuit and to the cathode layer in the fourth phase is a superposition of this signal output in the third phase with a touch scanning signal. This allows the sub-pixel circuit to operate in the same state as in the third phase (i.e., the light-emitting display phase). As such, where the touch screen panel is not touched by a human body, the capacitance provided by respective self-capacitance electrodes remains unchanged before and after application of the touch scanning signals, thereby ensuring accuracy of the touch position determination.

It is to be noted that in the in-cell touch screen panel according to the embodiment of the present disclosure, the operating state of a module refers to an ON state or OFF state of this module. Among the modules of the sub-pixel circuit, the data write module is taken as an example here. If the data write module is in an OFF state in the third phase, and is also in the OFF state in the fourth phase, then the operating state of the data write module in the fourth phase is referred to as being identical with that in the third phase.

According to the principle of the self-capacitance touch control, when the touch screen panel is not touched by the human body, the capacitance of the self-capacitance electrodes is a fixed value. When the touch screen panel is touched by the human body, the capacitance of the corresponding self-capacitance electrodes is a superposition of the fixed value with a human body capacitance. A touch detection chip may determine the touch position in a touch time period by detecting a change in the capacitance of respective self-capacitance electrodes. In the in-cell touch screen panel, to ensure that the capacitance of respective self-capacitance electrodes (i.e., the cathode layers of respective sub-pixel groups) in the fourth phase is a fixed value, that is, kept fixed before and after application of the touch scanning signal, a voltage difference between each cathode layer and its corresponding ground electrode (i.e., other electrodes than the cathode layer) needs to remain consistent. To this end, in the embodiment of the present embodiment, each of the signals output by the driving chip to the signal terminals of the sub-pixel circuit and to the cathode layer in the fourth phase is a superposition of this signal output in the third phase with the touch scanning signal. This way, in the case that the touch screen panel is not touched by a human body, the capacitance of respective self-capacitance electrodes does not vary before and after application of the touch scanning signal. Thereby accuracy of the touch position determination is ensured.

Furthermore, in the in-cell touch screen panel, by means of cooperation of the modules of the sub-pixel circuit, the drive current generated when the organic light-emitting device emits light is only related to the voltage of the data signal terminal and the voltage of the reference signal terminal, and is irrelevant to the threshold voltage of the driving control module. This can avoid the influence exerted by the threshold voltage of the driving control module on the current flowing through the organic light-emitting device, and thus enables the working current for driving the light-emitting device to emit light to remain consistent. Thereby, uniformity of the brightness of the images displayed in a display region of the display device is improved.

Figure 4:
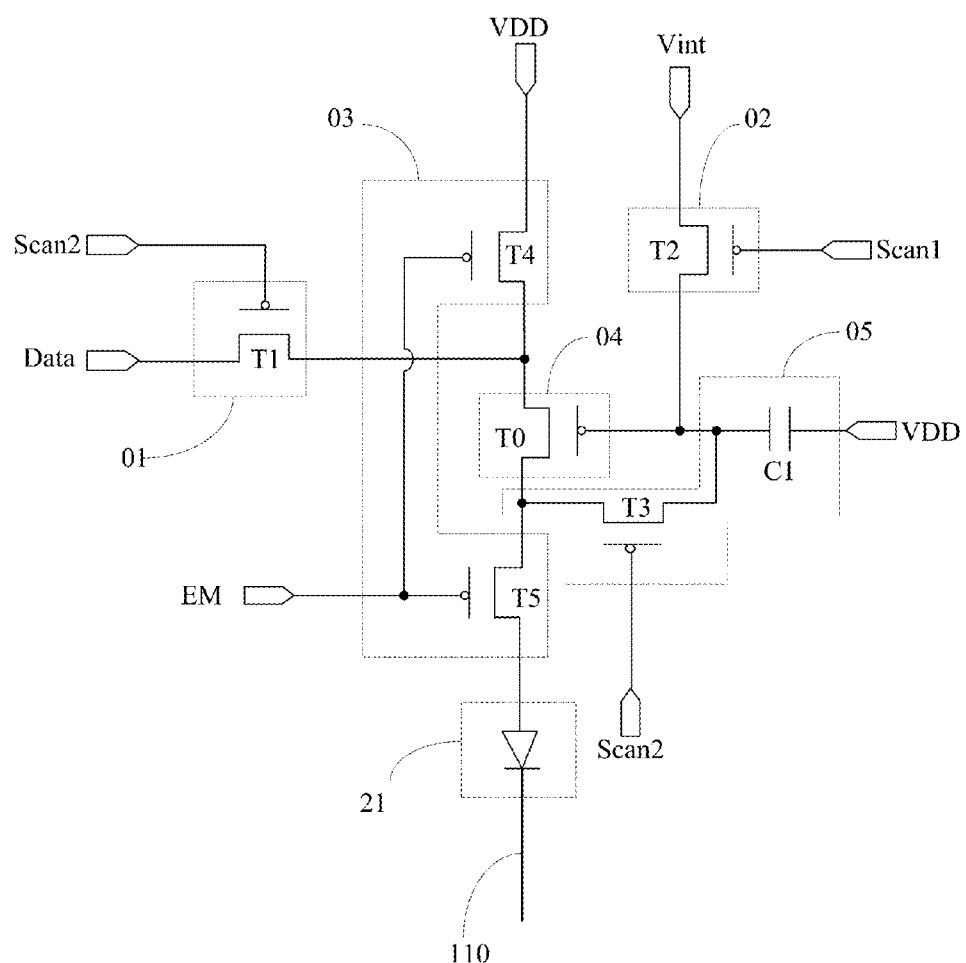
FIG. 4 is a specific structural schematic view of a sub-pixel circuit according to an embodiment of the present disclosure.

FIG. 4 is a specific structural schematic view of a sub-pixel circuit according to an embodiment of the present disclosure. As shown in FIG. 4, the data write module 01 may specifically comprise a first switch transistor T1. A gate of the first switch transistor T1 is the control terminal of the data write module 01, a source thereof is the input terminal of the data write module 01, and a drain thereof is the output terminal of the data write module 01. In an implementation, the first switch transistor T1 may be a P-type transistor or an N-type transistor.

The reset module 02 may specifically be a second switch transistor T2. A gate of the second switch transistor T2 is the control terminal of the reset module 02, a source thereof is the input terminal of the reset module 02, and a drain thereof is the output terminal of the reset module 02. In an implementation, the second switch transistor T2 may be a P-type transistor or an N-type transistor.

Furthermore, in the in-cell touch screen panel according to the embodiment of the present disclosure, from the first phase to the third phase, the voltage of the reset signal terminal may be identical with the voltage of the cathode layer. However, the present disclosure is not so limited.

The compensating module 05 may specifically comprise a third switch transistor T3 and a capacitor C1. A gate of the third switch transistor T3 is the control terminal of the compensating module 05, a source thereof is the second input terminal of the compensating module 05, and a drain thereof is connected with a terminal of the capacitor C1 and is the output terminal of the compensating module 05. The other terminal of the capacitor C1 is the first input terminal of the compensating module 05. In an implementation, the third switch transistor T3 may be a P-type transistor or an N-type transistor.

The driving control module 04 may specifically comprise a drive transistor T0. A gate of the drive transistor T0 is the control terminal of the driving control module 04, a source thereof is the input terminal of the driving control module 04, and a drain thereof is the output terminal of the driving control module 04. In an implementation, the drive transistor T0 is a P-type transistor.

The light-emitting control module 03 may specifically comprise a fourth switch transistor T4 and a fifth switch transistor T5. A gate of the fourth switch transistor T4 is connected with a gate of the fifth switch transistor T5 and is the control terminal of the light-emitting control module 03, a source of the fourth switch transistor T4 is the first input terminal of the light-emitting control module 03, and a drain of the fourth switch transistor T4 is the first output terminal of the light-emitting control module 03. A source of the fifth switch transistor T5 is the second input terminal of the light-emitting control module 03, and a drain thereof is the second output terminal of the light-emitting control module 03. In an implementation, the fourth switch transistor T4 and the fifth switch transistor T5 may each be a P-type transistor or an N-type transistor.

As shown in FIG. 4, the drive transistor T0 is generally a P-type transistor. As the threshold voltage of the P-type transistor has a negative value, to ensure normal operation of the drive transistor T0, the voltage of the corresponding first reference signal is generally a positive voltage, and the cathode layer is generally grounded or receives a negative voltage that is the second reference signal.

By way of example, the drive transistors and the switch transistors described above may be thin film transistors (TFT), or metal oxide semiconductor field effect transistors (MOSFET). In some embodiments, to simplify the manufacturing process, all switch transistors are N-type transistors or P-type transistors. In some embodiments, in the above sub-pixel circuit, since the drive transistor is a P-type transistor, all switch transistors may also be designed as P-type transistors (i.e., all transistors are P-type transistors). This way, the manufacturing process of the sub-pixel circuit may be simplified.

The specific structures of the sub-pixel circuit in the in-cell touch screen panel are described only for purposes of illustration, not for limitation. The present disclosure is not limited to the described specific structures.

The operating procedure of the sub-pixel circuit according to the embodiment of the present disclosure will be described by taking the sub-pixel circuit shown in FIG. 4 as an example, for which circuit the corresponding sequence diagram has been shown in FIG. 3. For ease of description, the source of the drive transistor T0 is designated as a first node A, and the gate of the drive transistor T0 is designated as a second node B. In the depictions below, a high level signal is represented with "1", and a low level signal is represented with "0". In addition, assume that from the first phase to the third phase, a potential of the reset signal output from the driving chip to the reset signal terminal Vint is $V_{ss}$, a potential of the first reference signal output from the driving chip to the reference signal terminal VDD is $V_{dd}$, and a potential of the second reference signal output to the cathode layer 213 is $V_{ss}$, and that in the fourth phase, an amplitude of the superposed touch scanning signal is $|\Delta V|$.

FIGS. 5a-5d are diagrams of operating states of a sub-pixel circuit according to an embodiment of the present disclosure in different phases. In these figures, a dashed circle superimposed on a transistor indicates that this transistor is in an OFF state.

In the first phase P1 (the reset phase), Scan1=0, Scan2=1, and EM=1.

Figure 5A:
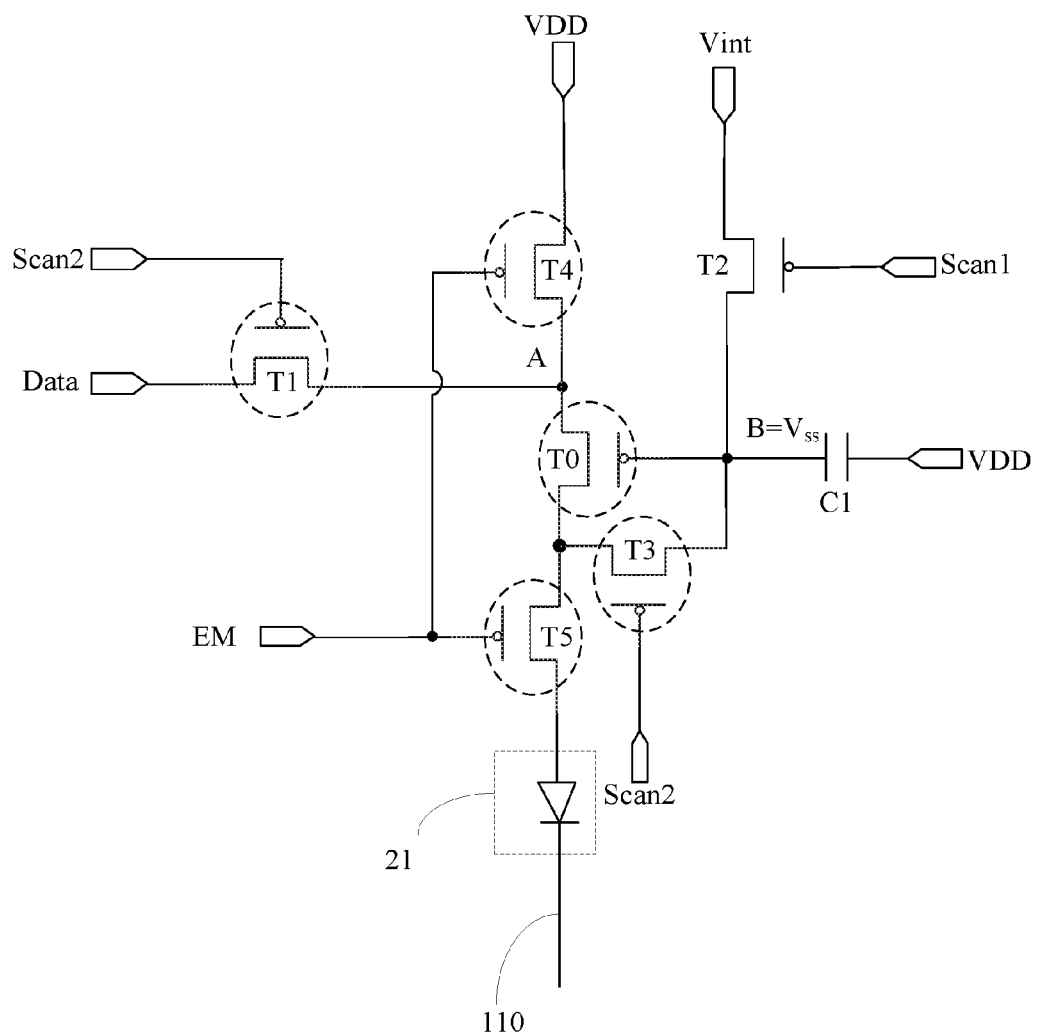
FIGS. 5a-5d are diagrams of operating states of a sub-pixel circuit according to an embodiment of the present disclosure in different phases.

As shown in FIG. 5a, the second switch transistor T2 is in an ON state, and other switch transistors (T1, T3, T4 and T5) and the drive transistor T0 are in an OFF state. The reset signal of the reset signal terminal Vint is passed to the drive transistor T0 through the turned-on second switch transistor T2, so that the potential of the second node B is the potential $V_{ss}$ of the reset signal.

In a second phase P2 (the data write phase), Scan1=1, Scan2=0, and EM=1.

Figure 5B:
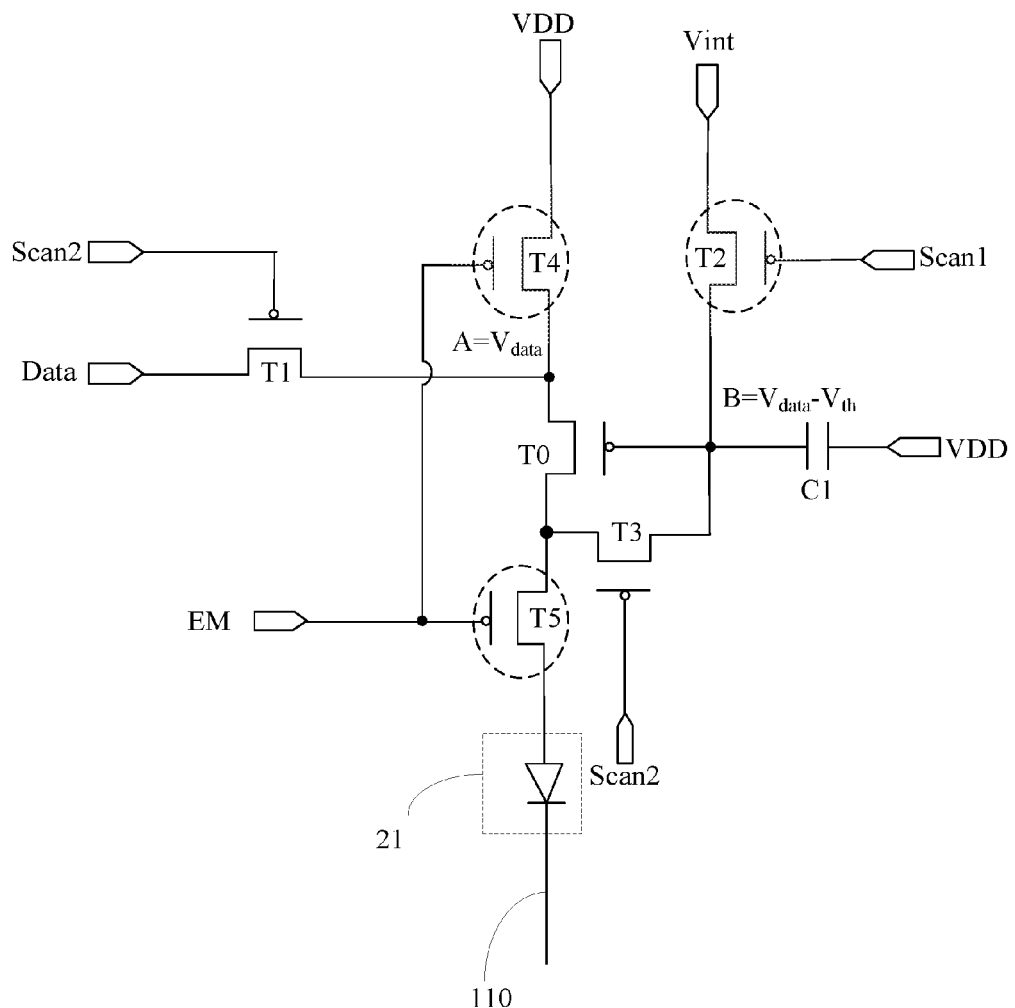

As shown in FIG. 5b, the first switch transistor T1 and the third switch transistor T3 are in an ON state, and other switch transistors (T2, T4 and T5) are in an OFF state. The capacitor C1 begins to charge. The data signal of the data signal terminal "Data" is passed to the source of the drive transistor through the turned-on first switch transistor, so that the potential of the first node A is the potential $V_{data}$ of the data signal. The turned-on third switch transistor T3 makes the drive transistor T0 a diode structure. The data signal of the first node A is passed to the second node B through the turned-on diode so that the potential of the second node B is $V_{data}-V_{th}$ ($V_{th}$ is the threshold voltage of the drive transistor T0). At this time, the capacitor C1 completes the charge, and the potential of the second node B remains at $V_{data}-V_{th}$. In addition, since the fifth drive transistor T5 is in an OFF state, there is no current flowing through the organic light-emitting device 21, indirectly lowering the loss of the service life of the organic light-emitting device 21.

In a third phase P3 (the light-emitting display phase), Scan1=1, Scan2=1, and EM=0.

Figure 5C:
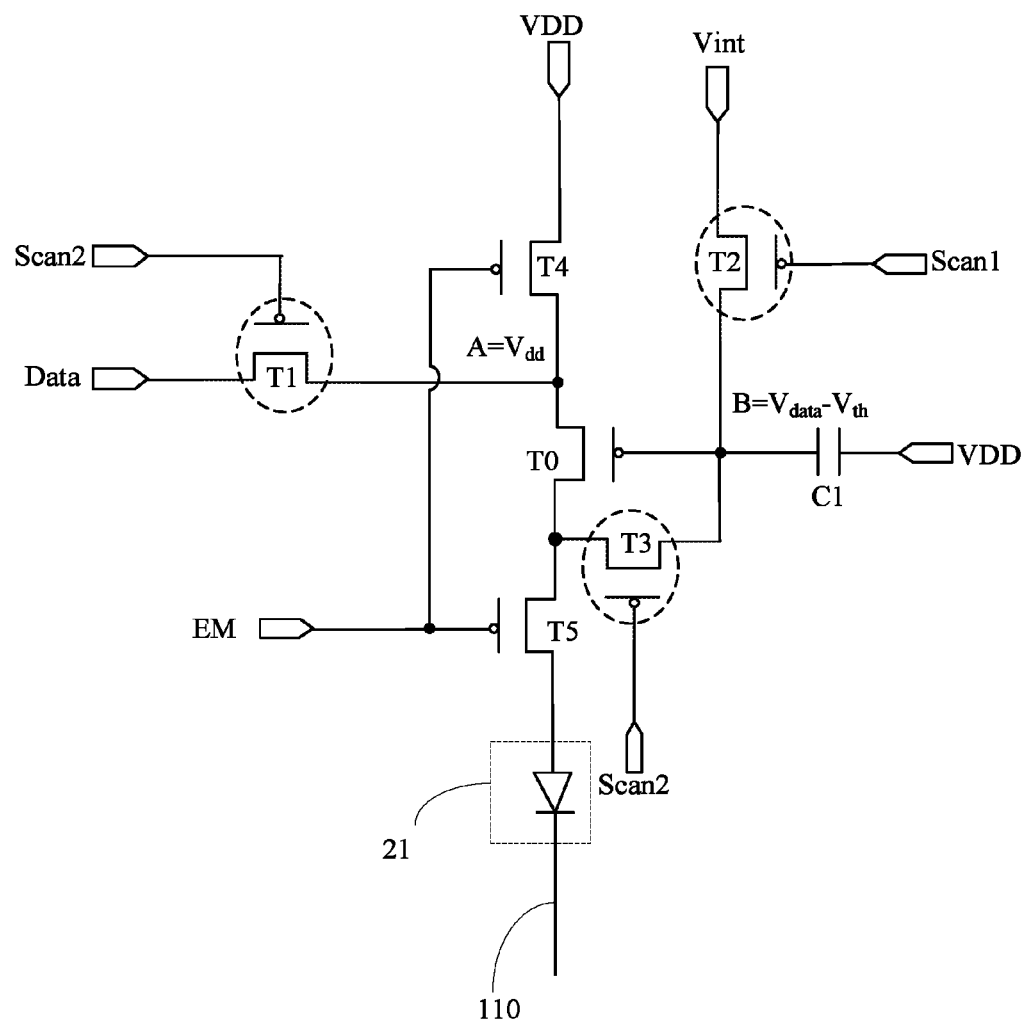

As shown in FIG. 5c, the fourth switch transistor T4, the fifth switch transistor T5 and the drive transistor T0 are in an ON state, and the remaining switch transistors (T1, T2 and T3) are in an OFF state. The first reference signal of the reference signal terminal VDD is passed to the first node A through the turned-on fourth switch transistor T4 so that the potential of the first node A become the potential $V_{dd}$ of the first reference signal. Due to the capacitor C1, the potential of the second node B still remains at the same potential $V_{data}-V_{th}$ as in the previous phase. In the present phase, the drive transistor T0 operates in a saturated state. According to the current properties in the saturated state, the working current $I_{OLED}$ flowing through the drive transistor T0 for driving the organic light-emitting device 21 to emit light satisfies the following equation:

$$I_{OLED}=K(V_{GS}-V_{th})^2=K[V_{dd}-(V_{data}-V_{th})-V_{th}]^2=K(V_{dd}-V_{data})^2$$

where K is a structural parameter that is relatively stable for the same structure and may be considered constant.

It can be seen that the working current $I_{OLED}$ of the organic light-emitting device 21 is no longer influenced by the threshold voltage $V_{th}$ of the drive transistor T0, but is only relevant to the data signal and the first reference signal. This thoroughly solves the influence caused by the threshold voltage drift of the drive transistor due to manufacturing process and long-term operation on the working current of the organic light-emitting device, thereby improving the uniformity of the display of the panel.

In a fourth phase P4 (the touch scanning phase), Scan1=1+|ΔV|, Scan2=1+|ΔV|, and EM=|ΔV|.

Since each of the signals of the signal terminals of the sub-pixel circuit and the cathode layer 213 is a superposition of the signal output in the third phase P3 with the touch scanning signal, the modules of the sub-pixel circuit operate in the same state as in the third phase.

Figure 5D:
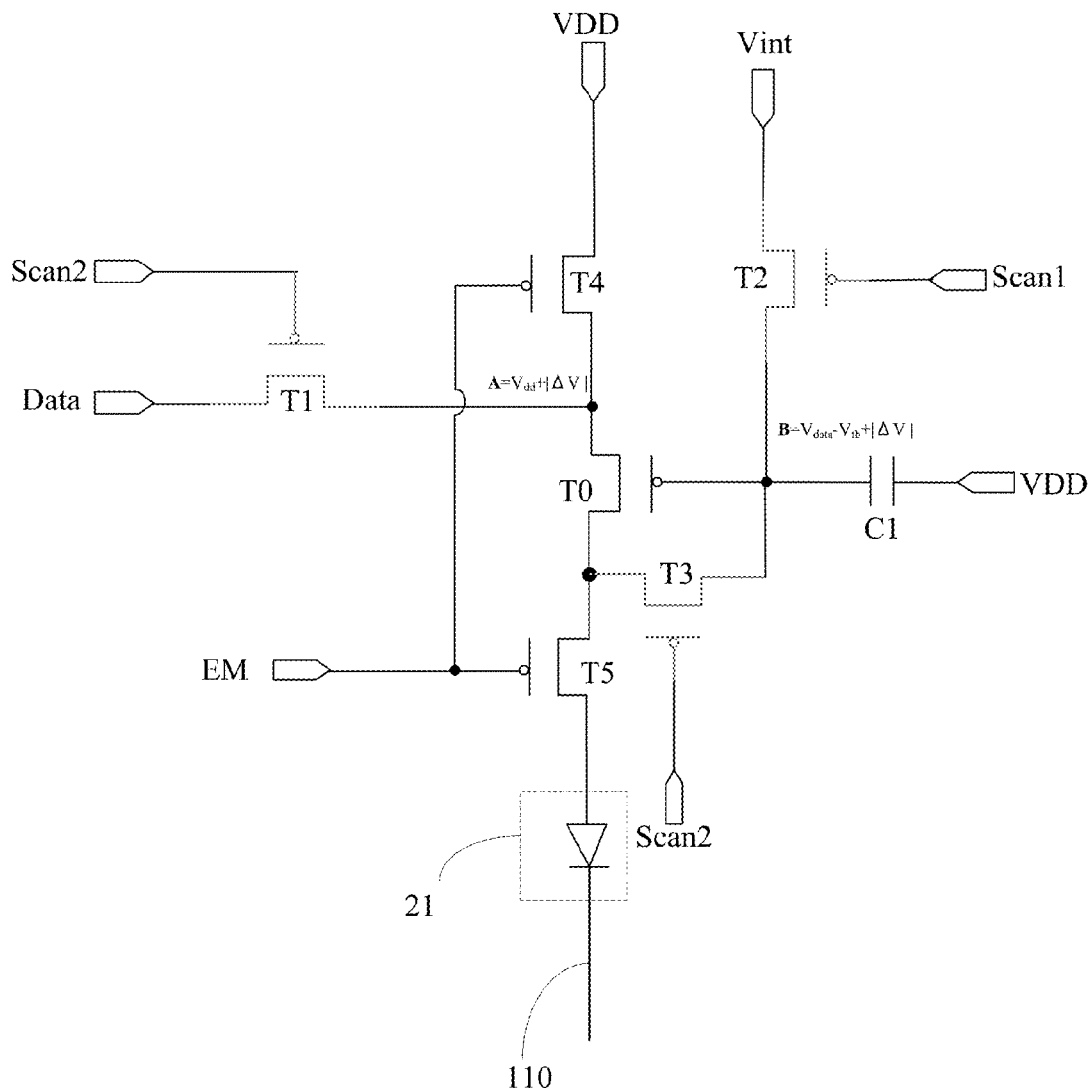

Hence, as shown in FIG. 5d, the fourth switch transistor T4, the fifth drive transistor T5 and the drive transistor T0 are still in an ON state, and other switch transistors (T1, T2 and T3) are still in an OFF state. The signal of the reference signal terminal VDD is passed to the first node A through the turned-on fourth switch transistor T4 so that the potential of the first node A becomes from $V_{dd}$ in the previous third phase P3 to $V_{dd}$+|ΔV|. Meanwhile, the potential of the terminal of the capacitor C1 that is connected with the reference signal terminal VDD also becomes from $V_{dd}$ in the previous third phase P3 to $V_{dd}$+|ΔV|. Since the second node B is in a floating state in this phase, to keep the voltage difference across the capacitor C1 unchanged, the potential of the second node B transits from $V_{data}-V_{th}$ in the previous third phase P3 to $V_{data}-V_{th}$+|ΔV|. In the present phase, the drive transistor T0 operates in the saturated state. According to the current properties of the saturated state, a working current $I_{OLED}$ flowing through the drive transistor T0 for driving the organic light-emitting device 21 to emit light satisfies the following equation:

$$I_{OLED}=K(V_{GS}-V_{th})^2=K[V_{dd}+|\Delta V|-(V_{data}-V_{th}+|\Delta V|)-V_{th}]^2=K(V_{dd}=V_{data})^2.$$

It can be seen that the working current $I_{OLED}$ of the organic light-emitting device 21 is consistent with that in the third phase P3. That is, the touch scanning signal |ΔV| superposed on respective signal terminals of the sub-pixel circuit and the cathode layer does not have an influence on the working current $I_{OLED}$ of the organic light-emitting device 21.

Moreover, in this phase, the cathode layer is reused as a self-capacitance electrode, and the driving chip determines a touch position by detecting a change in capacitance of the cathode layer. Since the respective signals output to the cathode layer and the signal terminals of the sub-pixel circuit are superposed with the same touch scanning signal, it may be ensured that the capacitance of the cathode layer (i.e., the self-capacitance electrode) is a fixed value before and after the application of the touch scanning signal. Thereby, accuracy of the touch position determination is ensured.

Furthermore, to simplify the manufacturing process, the wire connected with the cathode layer may be fabricated on the same layer as the sources, gates or drains of the transistors in the sub-pixel circuit or on the same layer as other signal lines on the array substrate. In this way, no new fabrication process needs to be added, except that patterning of the corresponding layers is to be altered. Thereby, the process is simplified, the production cost is saved, and the production efficiency is improved.

In some embodiments, in the above in-cell touch screen panel, the sub-pixel circuit is located between the anode layer and the array substrate. The array substrate further comprises data lines for connecting the data signal terminals in respective sub-pixel circuits with the driving chip respectively. The wire is disposed in the same layer as and insulated from the data lines.

In some embodiments, in the above in-cell touch screen panel, the transistors in the sub-pixel circuit each include an active layer, a gate insulating layer, a gate electrode, an inter-layer insulating layer, a source electrode and a drain electrode that are located on the array substrate in turn. The data lines, the source electrode and the drain electrode are disposed on the same layer. The wire is connected with the corresponding cathode layer through a via.

In some embodiments, the in-cell touch screen panel further comprises: a planarized layer located between the layer where the source electrode and the drain electrode are disposed and the anode layer; a sub-pixel defining layer located between the cathode layer and the planarized layer and surrounding the light-emitting layers; and a cathode connecting portion disposed on the same layer as the anode layer. The cathode connecting portion is connected with the respective wire through a via running through the planarized layer, and the cathode layer is connected with the corresponding cathode connecting portion through a via running through the sub-pixel defining layer.

In some embodiments, the in-cell touch screen panel further comprises a buffering layer located between the sub-pixel circuit and the array substrate.

The position of the wire in the in-cell touch screen panel according to the embodiment of the present disclosure is described below in connection with a specific embodiment.

Figure 6:
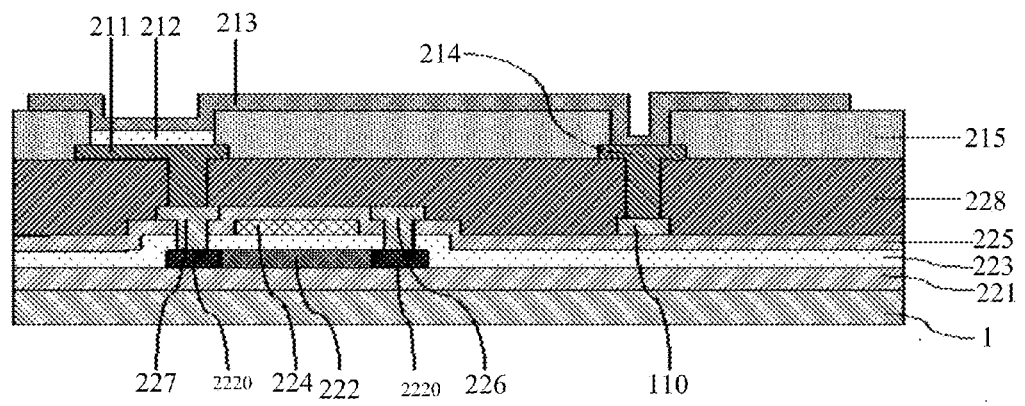
FIG. 6 is a structural schematic view of a portion of an in-cell touch screen panel according to another embodiment of the present disclosure.

FIG. 6 is a structural schematic view of a portion of an in-cell touch screen panel according to another embodiment of the present disclosure. As shown in FIG. 6, taking one sub-pixel as an example, the array substrate 1 is provided in turn with a buffering layer 221, an active layer 222, a gate insulating layer 223, a gate electrode 224, an inter-layer insulting layer 225, a source electrode 226, a drain electrode 227, a wire 110, a planarized layer 228, an anode layer 211, a cathode connecting portion 214, a light-emitting layer 212, a sub-pixel defining layer 215 surrounding the light-emitting layer 212, and a cathode layer 213. The source electrode 226, the drain electrode 227, and the wire 110 are disposed in the same layer.

The cathode layer 213 is connected with the cathode connecting portion 214 through a via running through the sub-pixel defining layer 215. The anode layer 211 is connected with the drain electrode 227 through a via running through the planarized layer 228. The cathode connecting portion 214 is connected with the wire 110 through a via running through the planarized layer 228. The source electrode 226 and the drain electrode 227 are connected with the active layer 222 respectively through vias running through the inter-layer insulating layer 225 and vias running through the gate insulating layer 223. The regions 2220 of the active layer 222 that are in contact with the source electrode 226 and the drain electrode 227 are treated by doping. Although only the active layer 222, the gate electrode 224, the source electrode 226 and the drain electrode 227 of the drive transistor T0 are shown in FIG. 6, it should be appreciated that the configuration of the switch transistor is similar to that of the drive transistor and thus will not be detailed here.

Specifically, in the in-cell touch screen panel according to the embodiment of the present disclosure, the via for connecting the cathode layer with the wire is disposed between adjacent sub-pixels. As such, damages to the performance of the light-emitting layer due to providing the via in the light-emitting layer may be avoided.

Figure 7A:
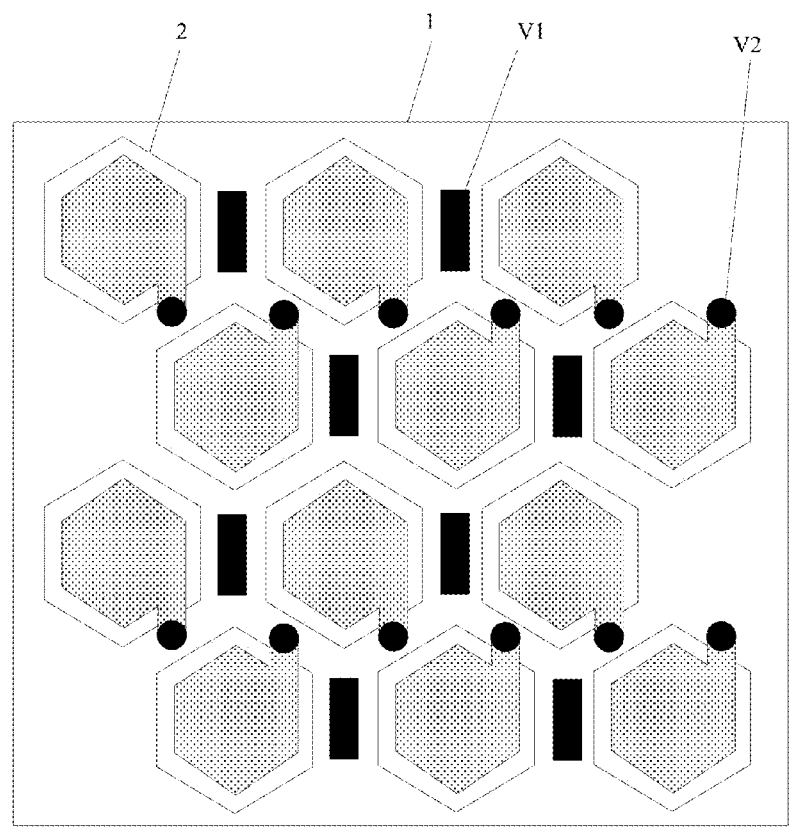
FIGS. 7a and 7b are schematic views of arrangement of sub-pixels of an in-cell touch screen panel according to an embodiment of the present disclosure.
Figure 7B:
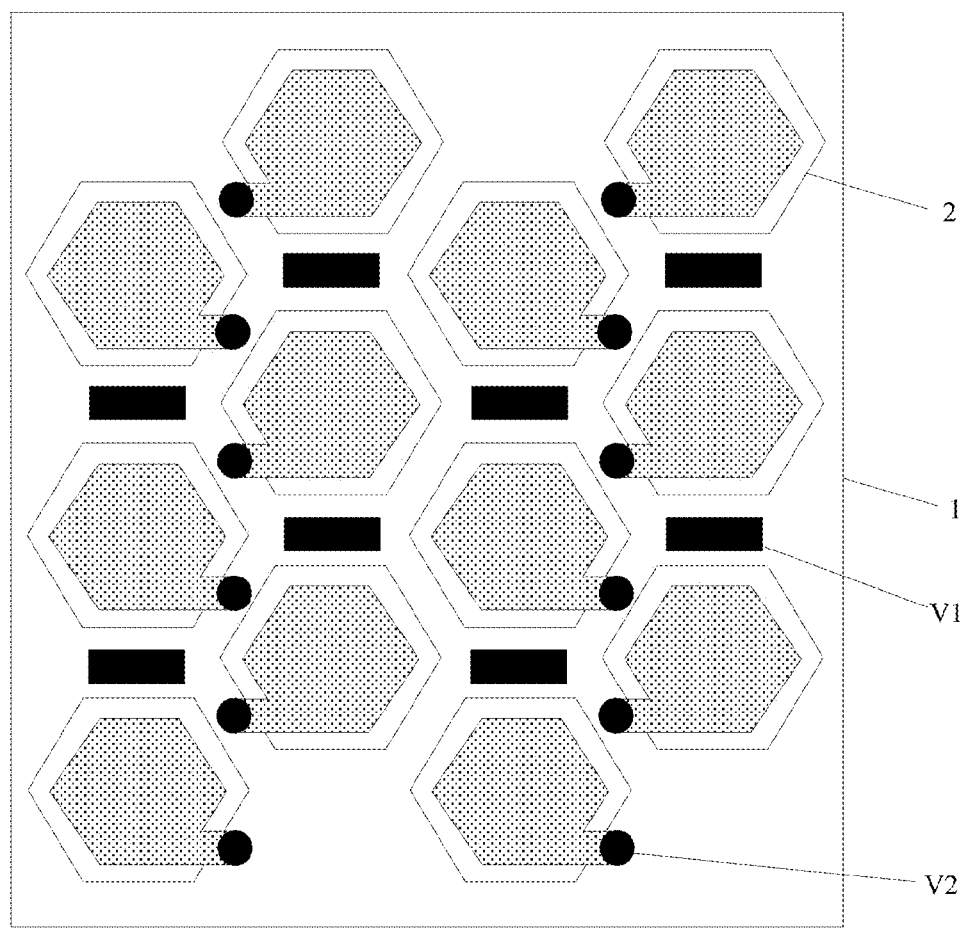

FIGS. 7a and 7b are schematic views of arrangement of sub-pixels of an in-cell touch screen panel according to an embodiment of the present disclosure. As shown in FIG. 7a and FIG. 7b, each sub-pixel 2 is of a hexagonal shape, and the sub-pixels 2 are regularly arranged on the array substrate 1. Specifically, as shown in FIG. 7a, the sub-pixels 2 are arranged side by side in a row direction, and the sub-pixels 2 at corresponding positions in two adjacent rows are arranged staggered in a column direction. In each row of the sub-pixels 2, a via V1 for connecting the cathode layer with the wire is arranged between every two adjacent sub-pixels 2. A via V2 for connecting the anode layer with the drain electrode is arranged in a gap between two adjacent rows of the sub-pixels. Alternatively, as shown in FIG. 7b, the sub-pixels 2 are arranged side by side in the column direction, and the sub-pixels 2 at corresponding positions in two adjacent columns are arranged staggered in the row direction. In each column of the sub-pixels 2, a via V1 for connecting the cathode layer with the wire is arranged between every two adjacent sub-pixels 2. A via V2 for connecting the anode layer with the drain electrode is arranged in a gap between two adjacent columns of the sub-pixels.

Based on the same inventive concept, embodiments of the present disclosure further provide a method of driving any one of the above-mentioned in-cell touch screen panels.

Figure 8:
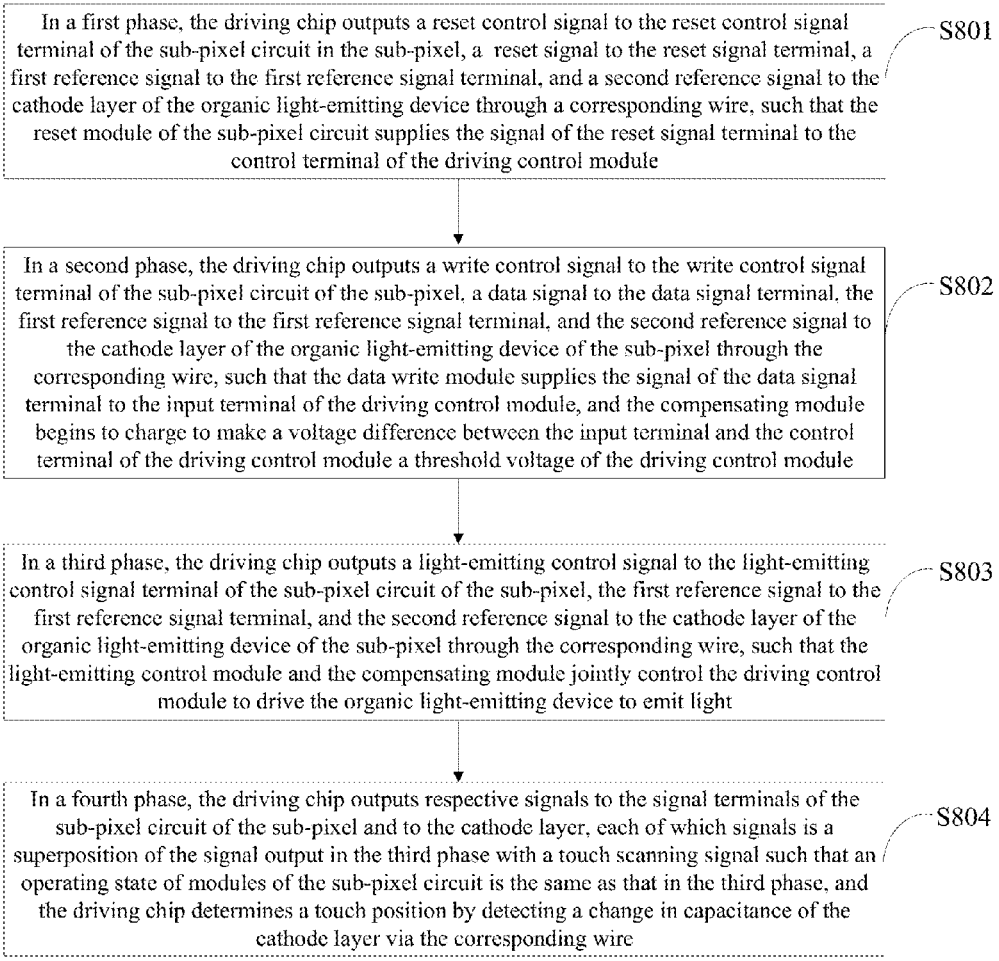
FIG. 8 is a flow chart of a method of driving an in-cell touch screen panel according to an embodiment of the present disclosure.

FIG. 8 is a flow chart of a method of driving an in-cell touch screen panel according to an embodiment of the present disclosure. As shown in FIG. 8, a frame period for each sub-pixel may comprise four phases.

At step S801, in a first phase, the driving chip outputs a reset control signal to the reset control signal terminal of the sub-pixel circuit of the sub-pixel, a reset signal to the reset signal terminal, a first reference signal to the first reference signal terminal, and a second reference signal to the cathode layer of the organic light-emitting device through a corresponding wire. The reset module of the sub-pixel circuit supplies the signal of the reset signal terminal to the control terminal of the driving control module.

At step S802, in a second phase, the driving chip outputs a write control signal to the write control signal terminal of the sub-pixel circuit of the sub-pixel, a data signal to the data signal terminal, the first reference signal to the first reference signal terminal, and the second reference signal to the cathode layer of the organic light-emitting device of the sub-pixel through the corresponding wire. The data write module supplies the signal of the data signal terminal to the input terminal of the driving control module. The compensating module begins to charge to make a voltage difference between the input terminal and the control terminal of the driving control module a threshold voltage of the driving control module.

At step S803, in a third phase, the driving chip outputs a light-emitting control signal to the light-emitting control signal terminal of the sub-pixel circuit of the sub-pixel, the first reference signal to the first reference signal terminal, and the second reference signal to the cathode layer of the organic light-emitting device of the sub-pixel through the corresponding wire. The light-emitting control module and the compensating module jointly control the driving control module to drive the organic light-emitting device to emit light.

At step S804, in a fourth phase, the driving chip outputs respective signals to the signal terminals of the sub-pixel circuit of the sub-pixel and to the cathode layer, each of which signals is a superposition of the signal output in the third phase with a touch scanning signal such that the modules of the sub-pixel circuit have an operating state the same as that in the third phase. The driving chip determines a touch position by detecting a change in capacitance of the cathode layer via the corresponding wire.

Embodiments of the present disclosure further provide a display device, which comprises the in-cell touch screen panel as set forth in the above embodiments. The display device may be any product or component that has display functionality, such as a mobile phone, a flat panel computer, a TV set, a display, a notebook, a digital photo frame and a navigator. Reference can be made to the aforesaid embodiments regarding the in-cell touch screen panel for the implementation of the display device, and thus no detailed description will be presented here.

In the in-cell touch screen panel, the driving method thereof and the display device according to embodiments of the present disclosure, one sub-pixel group is comprised of at least two sub-pixels, and cathode layers of different sub-pixel groups are independent of one another. This results from segmenting the cathode layer that is otherwise a whole surface in the prior art, and thus a sub-pixel group corresponds to a segment region in the segmented cathode layer. The cathode layer of each sub-pixel group is connected with the driving chip through a respective wire, which cathode layer is then reused as a self-capacitance touch electrode. The driving chip applies a touch scanning signal to the cathode layer via the wire, and determines a touch position by detecting a change in capacitance of the cathode layer via the wire. Thereby the touch control functionality is achieved. Furthermore, in the in-cell touch screen panel, each of the signals output by the driving chip to the signal terminals of the sub-pixel circuit and to the cathode layer in the fourth phase is a superposition of the signal output in the third phase with a touch scanning signal. This allows the sub-pixel circuit to operate in the same state as in the third phase (i.e., the light-emitting display phase). As such, where the touch screen panel is not touched by a human body, the capacitance of respective self-capacitance electrodes remains unchanged before and after application of the touch scanning signal, thereby ensuring accuracy of the touch position determination.

Various modification and variations to embodiments of the present disclosure may be made by a person having ordinary skill in the art without departing from the spirit and scope of the present disclosure. Thus, if these modifications and variations fall within the scope of the appended claims of the present disclosure and equivalents thereof, the present disclosure is intended to encompass these modifications and variations.

What is claimed is:

1. An in-cell touch screen panel, comprising:
    an array substrate;
    a plurality of sub-pixels located on the array substrate, each of the plurality of sub-pixels comprising an organic light-emitting device and a sub-pixel circuit electrically connected with the organic light-emitting device, the organic light-emitting device comprising an anode layer, a light-emitting layer and a cathode layer that are located on the array substrate in turn; and a driving chip;

wherein the plurality of sub-pixels are grouped into sub-pixel groups each comprising at least two sub-pixels, wherein the cathode layers of different sub-pixel groups are independent of one another; and wherein the driving chip is configured to output signals to signal terminals of each sub-pixel circuit and to the cathode layer of each sub-pixel group, wherein each of the signals output in a touch scanning phase is a superposition of the signal output in a preceding phase with a touch scanning signal such that each sub-pixel circuit operates in the touch scanning phase in the same state as in the preceding phase, wherein the sub-pixel circuit comprises a data write module, a reset module, a light-emitting control module, a driving control module, a compensating module, a data signal terminal, a write control signal terminal, a reset signal terminal, a reset control signal terminal, a light-emitting control signal terminal, and a reference signal terminal, wherein:

the driving control module has a control terminal, an input terminal, and an output terminal;

the data write module has an input terminal connected with the data signal terminal, a control terminal connected with the write control signal terminal, and an output terminal connected with the input terminal of the driving control module;

the reset module has an input terminal connected with the reset signal terminal, a control terminal connected with the reset control signal terminal, and an output terminal connected with the control terminal of the driving control module;

the compensating module has a first input terminal connected with the reference signal terminal, a second input terminal connected with the output terminal of the driving control module, a control terminal connected with the write control signal terminal, and an output terminal connected with the control terminal of the driving control module; and the light-emitting control module has a first input terminal connected with the reference signal terminal, a second input terminal connected with the output terminal of the driving control module, a control terminal connected with the light-emitting control signal terminal, a first output terminal connected with the input terminal of the driving control module, and a second output terminal connected with the anode layer of a corresponding organic light-emitting device; and wherein the cathode layer of each of the sub-pixel groups is connected with the driving chip via a respective wire.

2. The in-cell touch screen panel according to claim 1, wherein:

the data write module is configured to, in response to the signal of the write control signal terminal being a write control signal, provide the signal of the data signal terminal to the input terminal of the driving control module;

the compensating module is configured to, in response to the signal of the write control signal terminal being a write control signal, begin to charge to make a voltage difference between the input terminal and control terminal of the driving control module a threshold voltage of the driving control module;

the reset module is configured to, in response to the signal of the reset control signal terminal being a reset control signal, provide a signal of the reset signal terminal to the control terminal of the driving control module; and the light-emitting control module is configured to, in response to the signal of the light-emitting control signal terminal being a light-emitting control signal, control, together with the compensating module, the driving control module to drive the organic light-emitting device to emit light.

3. The in-cell touch screen panel according to claim 2, wherein the driving chip is configured during a frame period to:

output, in a first phase, a reset control signal to the reset control signal terminal and a reset signal to the reset signal terminal;

output, in a second phase, a write control signal to the write control signal terminal and a data signal to the data signal terminal;

output, in a third phase, a light-emitting control signal to the light-emitting control signal terminal; and output, in a fourth phase that is the touch scanning phase, to the signal terminals of the sub-pixel circuit and to the cathode layer of each sub-pixel group a superposition of respective signals output to the signal terminals and the cathode layer in the third phase with a same touch scanning signal, and determine a touch position by detecting a change in capacitance of the cathode layer via the respective wire; and wherein the driving chip outputs, from the first phase to the third phase, a first reference signal to the reference signal terminal, and a second reference signal to the cathode layer of the organic light-emitting device of the sub-pixel via the respective wire.

4. The in-cell touch screen panel according to claim 1, wherein the driving chip is configured during a frame period to:

output, in a first phase, a reset control signal to the reset control signal terminal and a reset signal to the reset signal terminal;

output, in a second phase, a write control signal to the write control signal terminal and a data signal to the data signal terminal;

output, in a third phase, a light-emitting control signal to the light-emitting control signal terminal; and output, in a fourth phase that is the touch scanning phase, to the signal terminals of the sub-pixel circuit and to the cathode layer of each sub-pixel group a superposition of respective signals output to the signal terminals and the cathode layer in the third phase with a same touch scanning signal, and determine a touch position by detecting a change in capacitance of the cathode layer via the respective wire; and wherein the driving chip outputs, from the first phase to the third phase, a first reference signal to the reference signal terminal, and a second reference signal to the cathode layer of the organic light-emitting device of the sub-pixel via the respective wire.

5. The in-cell touch screen panel according to claim 1, wherein the data write module comprises a first switch transistor, a gate thereof being the control terminal of the data write module, a source thereof being the input terminal of the data write module, and a drain thereof being the output terminal of the data write module.

6. The in-cell touch screen panel according to claim 5, wherein the reset module comprises a second switch transistor, a gate thereof being the control terminal of the reset module, a source thereof being the input terminal of the reset module, and a drain thereof being the output terminal of the reset module.

7. The in-cell touch screen panel according to claim 6, wherein the compensating module comprises a third switch transistor and a capacitor, wherein the third switch transistor has a gate that is the control terminal of the compensating module, a source that is the second input terminal of the compensating module, and a drain that is the output terminal of the compensating module, and wherein the capacitor has a terminal connected with the drain of the third switch transistor and another terminal that is the first input terminal of the compensating module.

8. The in-cell touch screen panel according to claim 7, wherein the driving control module comprises a drive transistor having a gate that is the control terminal of the driving control module, a source that is the input terminal of the driving control module, and a drain that is the output terminal of the driving control module.

9. The in-cell touch screen panel according to claim 8, wherein the light-emitting control module comprises a fourth switch transistor and a fifth switch transistor, wherein the fourth switch transistor has a gate that is the control terminal of the light-emitting control module, a source that is the first input terminal of the light-emitting control module, and a drain that is the first output terminal of the light-emitting control module, and wherein the fifth switch transistor has a gate connected with the gate of the fourth switch transistor, a source that is the second input terminal of the light-emitting control module, and a drain that is the second output terminal of the light-emitting control module.

10. The in-cell touch screen panel according to claim 9, wherein the switch transistors each are a P-type transistor or an N-type transistor.

11. The in-cell touch screen panel according to claim 9, wherein the sub-pixel circuit is located between the anode layer and the array substrate, and wherein the array substrate further comprises data lines for connecting the data signal terminals of the sub-pixel circuits to the driving chip, the data lines being disposed in the same layer as and insulated from the wires.

12. The in-cell touch screen panel according to claim 11, wherein the transistors in the sub-pixel circuit each comprise an active layer, a gate insulating layer, a gate electrode, an insulating layer, a source electrode and a drain electrode that are located on the array substrate in turn, wherein the source electrode and the drain electrode are disposed on the same layer as the data lines, and wherein the wires are connected with respective cathode layers through respective vias.

13. The in-cell touch screen panel according to claim 12, further comprising:
 a planarized layer located between the layer where the source electrodes and the drain electrodes are disposed and the anode layers;
 a sub-pixel defining layer located between the cathode layers and the planarized layer and surrounding the light-emitting layers; and
 cathode connecting portions disposed on the same layer as the anode layers;
 wherein the cathode connecting portions are connected with respective wires through respective vias running through the planarized layer, and wherein the cathode layers are connected with respective cathode connecting portions through respective vias running through the sub-pixel defining layer.

14. The in-cell touch screen panel according to claim 12, wherein the plurality of sub-pixels have a hexagonal shape and are arranged regularly on the array substrate, wherein the sub-pixels are arranged side by side in a row direction, the sub-pixels at corresponding positions in every two adjacent rows are arranged staggered in a column direction, and the vias for connecting the cathode layers with the wires are arranged between every two adjacent sub-pixels in each row of sub-pixels, and wherein the in-cell touch screen panel further comprises vias arranged in a gap between two adjacent rows for connecting the anode layers with the drain electrodes.

15. The in-cell touch screen panel according to claim 12, wherein the plurality of the sub-pixels each have a hexagonal shape and are arranged regularly on the array substrate, wherein the sub-pixels are arranged side by side in a column direction, the sub-pixels at corresponding positions in every two adjacent columns are arranged staggered in a row direction, and the vias for connecting the cathode layers with the wires are arranged between every two adjacent sub-pixels in each column, and wherein the in-cell touch screen panel further comprises vias arranged in a gap between two adjacent columns for connecting the anode layers with the drain electrodes.

16. The in-cell touch screen panel according to claim 8, wherein the drive transistor is a P-type transistor.

17. A display device comprising the in-cell touch screen panel according to claim 1.

18. A method of driving the in-cell touch screen panel according to claim 1, comprising:
 outputting, by the driving chip during a frame period, signals to signal terminals of each sub-pixel circuit and to the cathode layer of each sub-pixel group,
 wherein each of the signals output in a touch scanning phase is a superposition of the signal output in a preceding phase with a touch scanning signal such that each sub-pixel circuit operates in the touch scanning phase in the same state as in the preceding phase.

19. The method according to claim 18, wherein the sub-pixel circuit comprises a data write module, a reset module, a light-emitting control module, a driving control module, a compensating module, a data signal terminal, a write control signal terminal, a reset signal terminal, a reset control signal terminal, a light-emitting control signal terminal, and a reference signal terminal, wherein:
 the driving control module has a control terminal, an input terminal, and an output terminal;
 the data write module has an input terminal connected with the data signal terminal, a control terminal connected with the write control signal terminal, and an output terminal connected with the input terminal of the driving control module;
 the reset module has an input terminal connected with the reset signal terminal, a control terminal connected with the reset control signal terminal, and an output terminal connected with the control terminal of the driving control module;
 the compensating module has a first input terminal connected with the reference signal terminal, a second input terminal connected with the output terminal of the driving control module, a control terminal connected with the write control signal terminal, and an output terminal connected with the control terminal of the driving control module; and
 the light-emitting control module has a first input terminal connected with the reference signal terminal, a second input terminal connected with the output terminal of the driving control module, a control terminal connected with the light-emitting control signal terminal, a first output terminal connected with the input terminal of the driving control module, and a second output terminal connected with the anode layer of a corresponding organic light-emitting device; and wherein the cathode layer of each of the sub-pixel groups is connected with the driving chip via a respective wire, the method comprising:

outputting, by the driving chip in a first phase of the frame period, a reset control signal to the reset control signal terminal, a reset signal to the reset signal terminal, a first reference signal to the reference signal terminal, and a second reference signal to the cathode layer of the organic light-emitting device of the sub-pixel through the respective wire, such that the reset module supplies the signal of the reset signal terminal to the control terminal of the driving control module;

outputting, by the driving chip in a second phase of the frame period, a write control signal to the write control signal terminal, a data signal to the data signal terminal, the first reference signal to the reference signal terminal, and the second reference signal to the cathode layer of the organic light-emitting device of the sub-pixel through the respective wire, such that the data write module supplies the signal of the data signal terminal to the input terminal of the driving control module, and the compensating module begins to charge to make a voltage difference between the input terminal and the control terminal of the driving control module a threshold voltage of the driving control module;

outputting, by the driving chip in a third phase of the frame period, a light-emitting control signal to the light-emitting control signal terminal, the first reference signal to the reference signal terminal, and the second reference signal to the cathode layer of the organic light-emitting device of the sub-pixel through the respective wire, such that the light-emitting control module and the compensating module jointly control the driving control module to drive the organic light-emitting device to emit light; and outputting, by the driving chip in a fourth phase of the frame period that is the touch scanning phase, to the signal terminals of the sub-pixel circuit and to the cathode layer of each sub-pixel group a superposition of respective signals output to the signal terminals and the cathode layer in the third phase with a same touch scanning signal, and determining a touch position by detecting a change in capacitance of the cathode layer via the respective wire.

\* \* \* \* \*